US012564020B2

(12) United States Patent
Mitsugi

(10) Patent No.: US 12,564,020 B2
(45) Date of Patent: Feb. 24, 2026

(54) PATTERN FORMING METHOD, SEMICONDUCTOR DEVICE MANUFACTURING METHOD, AND PATTERN FORMING APPARATUS

(71) Applicant: KIOXIA CORPORATION, Tokyo (JP)

(72) Inventor: Satoshi Mitsugi, Kawasaki Kanagawa (JP)

(73) Assignee: Kioxia Corporation, Tokyo (JP)

( * ) Notice: Subject to any disclaimer, the term of this patent is extended or adjusted under 35 U.S.C. 154(b) by 676 days.

(21) Appl. No.: 17/900,250

(22) Filed: Aug. 31, 2022

(65) Prior Publication Data

US 2023/0298888 A1　　Sep. 21, 2023

(30) Foreign Application Priority Data

Mar. 18, 2022　　(JP) .................................. 2022-044426

(51) Int. Cl.
| | |
|---|---|
| *H01L 21/027* | (2006.01) |
| *G03F 1/42* | (2012.01) |
| *G03F 7/00* | (2006.01) |
| *H01L 21/311* | (2006.01) |
| *G03F 7/038* | (2006.01) |
| *G03F 7/039* | (2006.01) |
| *G03F 7/09* | (2006.01) |

(52) U.S. Cl.
CPC ............ *H01L 21/0271* (2013.01); *G03F 1/42* (2013.01); *G03F 7/0002* (2013.01); *H01L 21/31144* (2013.01); *G03F 7/038* (2013.01); *G03F 7/039* (2013.01); *G03F 7/094* (2013.01)

(58) Field of Classification Search
CPC .. H01L 21/0271; H01L 21/31144; G03F 1/42; G03F 7/0002
See application file for complete search history.

(56) References Cited

U.S. PATENT DOCUMENTS

| | | |
|---|---|---|
| 8,506,830 B2 | 8/2013 | Furusho |
| 8,647,106 B2 | 2/2014 | Inanami et al. |
| 8,906,598 B2 | 12/2014 | Kozawa |
| 2011/0143271 A1 | 6/2011 | Koshiba |
| 2012/0168404 A1 | 7/2012 | Lee |
| 2017/0252775 A1 | 9/2017 | Tamura |
| 2019/0033708 A1 | 1/2019 | Cherala |

FOREIGN PATENT DOCUMENTS

| | | |
|---|---|---|
| JP | H02304914 A | 12/1990 |
| JP | 2007248943 A | 9/2007 |
| JP | 2009229957 A | 10/2009 |
| JP | 2010245094 A | 10/2010 |

(Continued)

OTHER PUBLICATIONS

Japanese Office Action dated Jun. 24, 2025, mailed in counterpart Japanese Application No. 2022-044426, 6 pages.

*Primary Examiner* — Suberr L Chi

(74) *Attorney, Agent, or Firm* — Kim & Stewart LLP

(57) ABSTRACT

According to one embodiment, a pattern forming method includes forming a first resin pattern on a substrate with a first resin. The first resin pattern includes a first transfer pattern and a first mark. A second resin is dispensed to cover the first mark of the first resin pattern. A first pattern is formed including the first transfer pattern and the second resin covering the first mark. The first pattern is then transferred to a first process film on the substrate.

17 Claims, 14 Drawing Sheets

(56)     References Cited

FOREIGN PATENT DOCUMENTS

| | | | |
|----|------------|----|---------|
| JP | 2010284921 | A | 12/2010 |
| JP | 2011124389 | A | 6/2011 |
| JP | 2011249648 | A | 12/2011 |
| JP | 2013222791 | A | 10/2013 |
| JP | 5404140 | B2 | 1/2014 |
| JP | 2016187029 | A | 10/2016 |
| JP | 2017162875 | A | 9/2017 |
| JP | 2019029663 | A | 2/2019 |
| JP | 2021002665 | A | 1/2021 |
| WO | 2010073390 | A1 | 7/2010 |
| WO | 2011049078 | A1 | 4/2011 |

FIG. 10

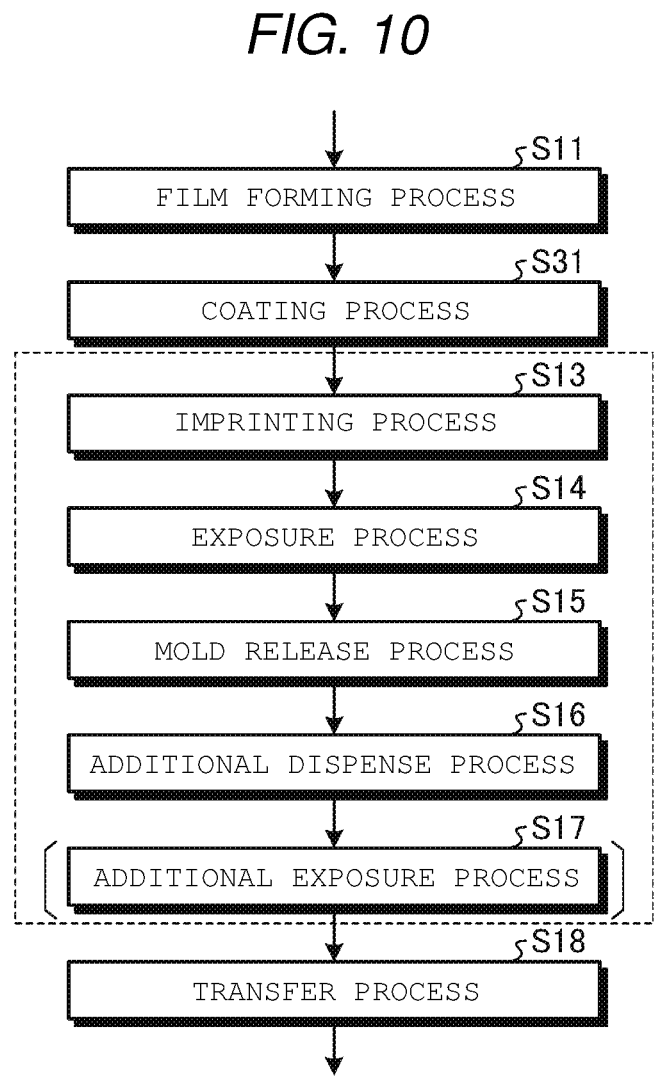

FILM FORMING PROCESS — S11

COATING PROCESS — S31

IMPRINTING PROCESS — S13

EXPOSURE PROCESS — S14

MOLD RELEASE PROCESS — S15

ADDITIONAL DISPENSE PROCESS — S16

ADDITIONAL EXPOSURE PROCESS — S17

TRANSFER PROCESS — S18

FIG. 11

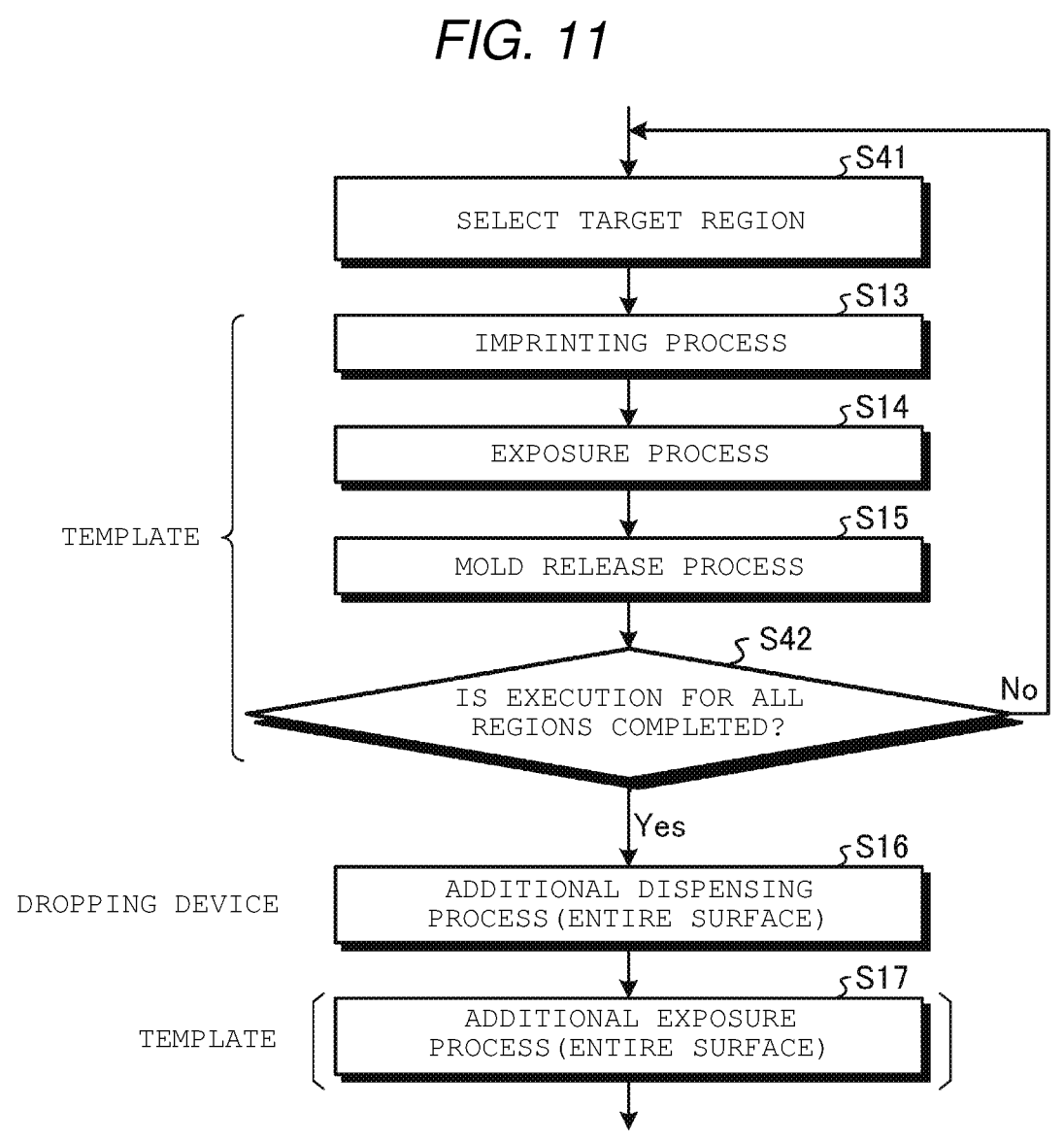

```
                            ┌──────────────────────────┐ ⌐S41
                            │   SELECT TARGET REGION   │
                            └──────────────────────────┘
                                        │
                            ┌──────────────────────────┐ ⌐S13
                            │    IMPRINTING PROCESS    │
                            └──────────────────────────┘
                                        │
                            ┌──────────────────────────┐ ⌐S14
                            │     EXPOSURE PROCESS     │
                            └──────────────────────────┘
        TEMPLATE                        │
                            ┌──────────────────────────┐ ⌐S15
                            │   MOLD RELEASE PROCESS   │
                            └──────────────────────────┘
                                        │
                                       ◇ ⌐S42
                            IS EXECUTION FOR ALL         No
                            REGIONS COMPLETED?
                                        │
                                      Yes
                            ┌──────────────────────────┐ ⌐S16
   DROPPING DEVICE          │  ADDITIONAL DISPENSING   │
                            │ PROCESS(ENTIRE SURFACE)  │
                            └──────────────────────────┘
                                        │
                            ┌──────────────────────────┐ ⌐S17
        TEMPLATE            │   ADDITIONAL EXPOSURE    │
                            │ PROCESS(ENTIRE SURFACE)  │
                            └──────────────────────────┘
                                        │
```

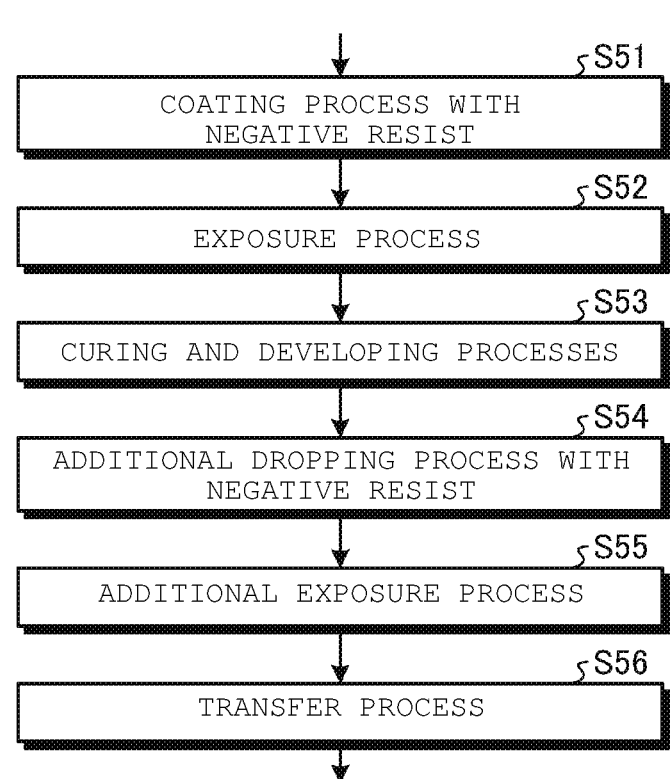

S51
COATING PROCESS WITH
NEGATIVE RESIST

S52
EXPOSURE PROCESS

S53
CURING AND DEVELOPING PROCESSES

S54
ADDITIONAL DROPPING PROCESS WITH
NEGATIVE RESIST

S55
ADDITIONAL EXPOSURE PROCESS

S56
TRANSFER PROCESS

FIG. 15

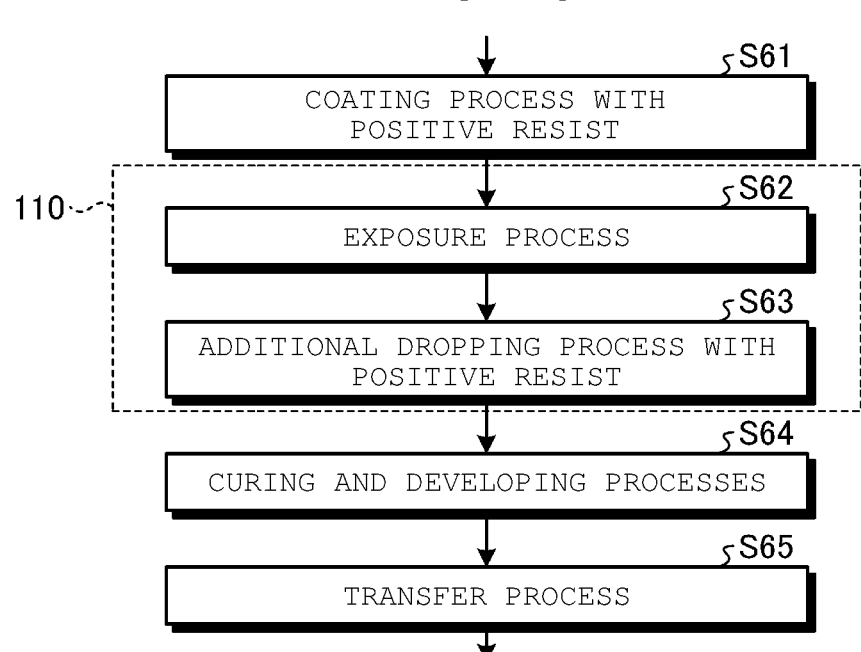

S61
COATING PROCESS WITH
POSITIVE RESIST

110

S62
EXPOSURE PROCESS

S63
ADDITIONAL DROPPING PROCESS WITH
POSITIVE RESIST

S64
CURING AND DEVELOPING PROCESSES

S65
TRANSFER PROCESS

PATTERN FORMING METHOD, SEMICONDUCTOR DEVICE MANUFACTURING METHOD, AND PATTERN FORMING APPARATUS

CROSS-REFERENCE TO RELATED APPLICATION(S)

This application is based upon and claims the benefit of priority from Japanese Patent Application No. 2022-044426, filed Mar. 18, 2022, the entire contents of which are incorporated herein by reference.

FIELD

Embodiments described herein relate generally to a pattern forming method, a semiconductor device manufacturing method, and a pattern forming apparatus.

BACKGROUND

Nanoimprint lithography (NIL) or other lithography processes are performed in the manufacture of semiconductor devices. In such a lithography process, an alignment process is performed to align a pattern already formed on a wafer with a pattern to be transferred to the wafer. For example, in the alignment process, a relative position between the wafer and a transfer pattern is adjusted so that an alignment mark already formed on the wafer matches a template mark provided in the transfer pattern.

BRIEF DESCRIPTION OF THE DRAWINGS

FIG. 10 is a flowchart illustrating a process flow when the pattern forming method according to Modified Example of the first embodiment is executed.

FIG. 11 is a diagram illustrating an example of a process flow of the pattern forming apparatus when a substrate coated with a resist on the entire surface is loaded.

FIG. 14 is a flowchart illustrating a process flow when a pattern forming method according to a first example of the second embodiment is executed.

FIG. 15 is a flowchart illustrating a process flow when a pattern forming method according to a second example of the second embodiment is executed.

DETAILED DESCRIPTION

Figure 1:
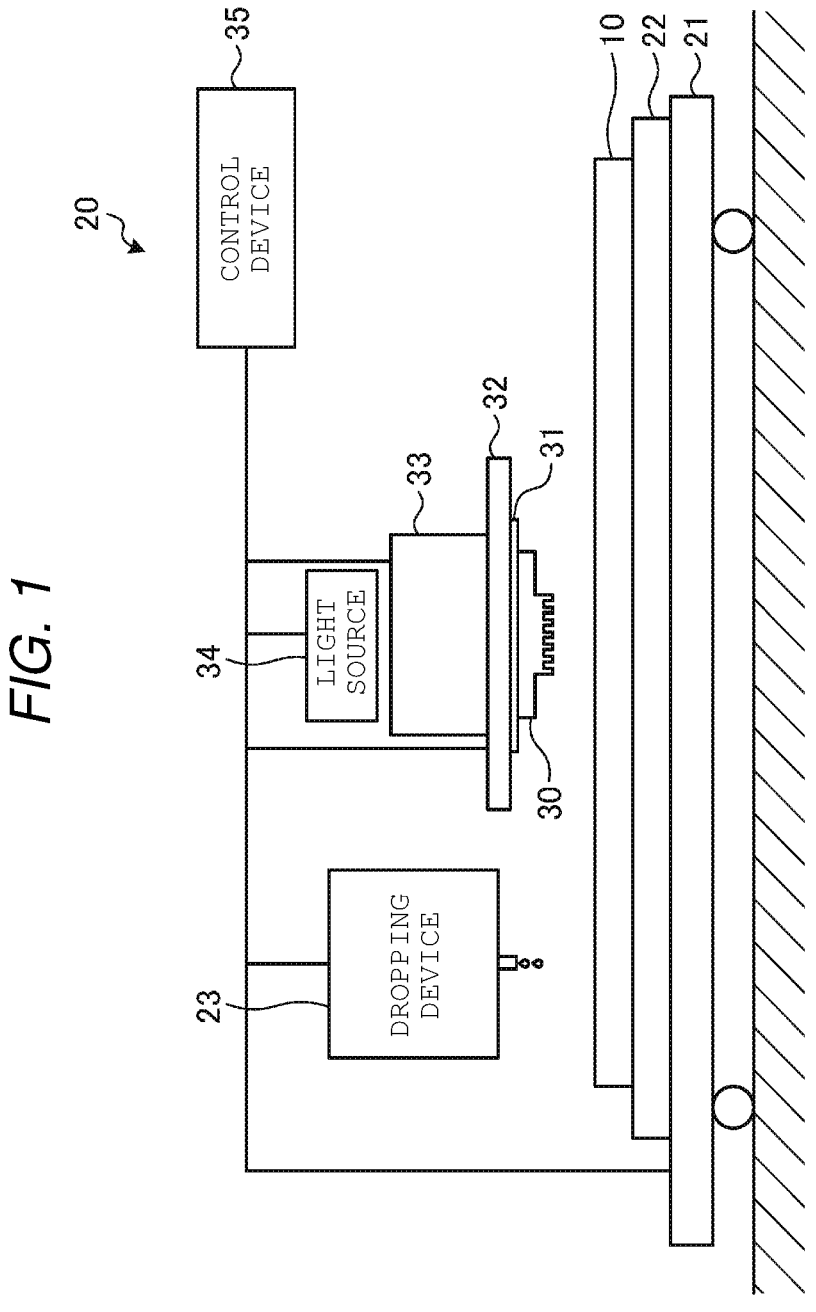
FIG. 1 is a diagram illustrating a configuration of a pattern forming apparatus.

Embodiments provide a pattern forming method, a semiconductor device manufacturing method, and a pattern forming apparatus permitting a more efficient designing of a device layout to account for the presence of alignment marks or the like.

In general, according to one embodiment, a pattern forming method is provided. The pattern forming method includes forming a first resin pattern on a substrate with a first resin. The first resin pattern includes a first transfer pattern and a first mark. A second resin is then dispensed to cover the first mark of the first resin pattern. A first pattern including the first transfer pattern and the second resin covering the first mark is formed. The first pattern is then transferred to a first process film on the substrate.

Hereinafter, certain example embodiments will be described with reference to the drawings. In the following description, components having the same function and configuration are generally denoted by the same reference numerals.

First Embodiment

A pattern forming method according to a first embodiment will be described. The pattern forming method according to the first embodiment patterns a process film 11 (see FIG. 4) on a substrate to have a shape of a first pattern by using a technique of NIL. In general, the first pattern corresponds to a pattern formed in a NIL template (e.g., template 30).

FIG. 1 is a diagram illustrating a configuration of a pattern forming apparatus 20 of an embodiment. In the pattern forming method according to the first embodiment, a process film 11 ultimately having a shape of a first pattern is formed on the substrate 10. The pattern forming apparatus 20 forms a resist pattern in which a portion of a transfer pattern corresponding to the shape of the first pattern is cured above the process film 11 by using a NIL technique.

In an embodiment, the substrate 10 has one or a plurality of layers already formed on a semiconductor substrate such as a silicon wafer. An alignment mark 51 (see FIG. 4) is formed in advance on or in any of the layers. The resist is a resin or a resin precursor. The resist on the substrate 10 ultimately serves as an etching mask for forming the first pattern in the process film 11.

The pattern forming apparatus 20 includes a substrate stage 21, a chuck 22, a dropping device 23 (resist dispensing device), a template 30, a template stage 31, a stage base 32, an alignment unit 33, a light source 34, and a control device 35.

The substrate stage 21 can move in parallel on a reference plane. The chuck 22 is provided on the substrate stage 21 and maintains the upper surface of the substrate 10 parallel to the reference plane. Therefore, the substrate stage 21 can move the substrate 10 to any position on the reference plane.

The dropping device 23 dispenses the resist as droplets onto the upper surface of the substrate 10. For example, the dropping device 23 ejects the resist as droplets by an inkjet method. As an example, the dropping device 23 ejects the droplets having a size of a diameter of several micrometers to several tens of micrometers and a volume of about several picoliters or the droplets having a size smaller than the size. By providing such a dropping device 23, the pattern forming apparatus 20 can execute a dropping process (a droplet dispensing process) and an additional dropping process of dispensing the resist onto the substrate 10.

The template 30 is an example of an original plate to pattern the process film 11 into a shape of the first pattern on the substrate 10. The template 30 is, for example, a plate-shaped template. The template 30 has a groove, that is, a recessed pattern, corresponding in shape and position to the transfer pattern for the resist formed on the substrate 10. Further, the template 30 is made of a material that transmits visible light and ultraviolet light.

The template stage 31 holds the template 30. The template stage 31 holds the template 30 so that the grooved surface faces the upper surface of the substrate 10 provided on the substrate stage 21.

The stage base 32 moves the template stage 31 maintaining the template 30 so as to be close to and separate from the upper surface of the substrate 10. By including the template 30, the template stage 31, and the stage base 32, the pattern forming apparatus 20 can execute an imprinting process of pressing the grooved surface of the template 30 against the substrate 10 on which the resist has been dispensed and a mold release process of separating the template 30 from the substrate 10.

The alignment unit 33 includes a mechanism that detects a positional deviation between a pattern already formed on the substrate 10 and the pattern formed on the template 30. The alignment unit 33 includes, for example, an imaging unit such as the camera. For example, the alignment unit 33 images the alignment mark 51 formed in advance on the substrate 10 and a template mark 52 formed on the template 30 from a position above the template 30 and generates an image illustrating a deviation between the alignment mark 51 and the template mark 52. By including the alignment unit 33, the pattern forming apparatus 20 can execute an alignment process of aligning the pattern already formed on the substrate 10 with the pattern to be formed by pressing the template 30 against the substrate 10, that is, aligning the substrate 10 with the template 30.

The light source 34 emits light. For example, the light source 34 emits ultraviolet light. The light source 34 irradiates the resist with light via the template 30 while the template 30 is pressed against the substrate 10 on which the resist has been dispensed. By including the light source 34, the pattern forming apparatus 20 can execute an exposure process of irradiating the resist with light while the template 30 is pressed against the substrate 10 with the resist thereon. Further, by including the light source 34, the pattern forming apparatus 20 can execute an additional exposure process of irradiating the resist dispensed by the additional dropping process.

The control device 35 controls the substrate stage 21 to move the substrate 10 to a designated position. The control device 35 controls the dropping device 23 to drop the resist on the designated position on the substrate 10. Furthermore, the control device 35 controls the substrate stage 21 on the basis of the image detected by the alignment unit 33 to align the pattern already formed on the substrate 10 with the template 30. The control device 35 also controls the light source 34 to irradiate the substrate 10 with light. The control device 35 also controls the stage base 32 to cause the template 30 and the substrate 10 to move closer to each other and away from each other. By including such a control device 35, the pattern forming apparatus 20 can execute a dropping process and an additional dropping process for dispensing the resist at any position on the substrate 10. Also, by including such a control device 35, the pattern forming apparatus 20 can execute the alignment process, the imprinting process, the exposure process, the mold release process, and the additional exposure process on any region on the substrate 10.

The control device 35 has an information processing function and includes a processor, for example that executes a program. By operating according to the program, the control device 35 can control the execution order of the dropping process, the imprinting process, the exposure process, the mold release process, the additional dropping process, and the additional exposure process.

Figure 2:
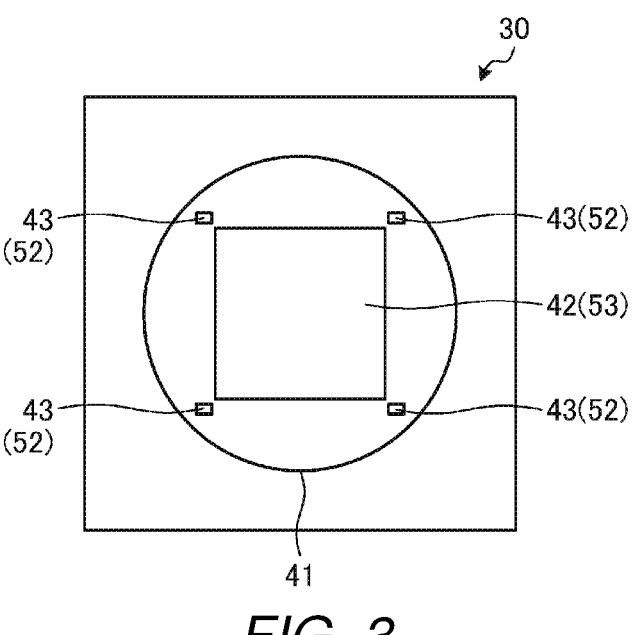
FIG. 2 is a diagram illustrating an example of a template viewed from the lower surface side.

FIG. 2 is a diagram illustrating an example of the template 30 viewed from the lower surface side (that is, the surface facing the substrate 10). A mesa portion 41 projecting downward is formed in the central portion of the lower surface of the template 30. It is noted that, although a circular mesa portion 41 is exemplified in FIG. 2, the mesa portion 41 may be rectangular in other examples.

The mesa portion 41 includes a pattern region 42 and a plurality of alignment regions 43. In the pattern region 42, a pattern 53 to be transferred to the substrate 10 is formed.

The template marks 52 used for the alignment process are formed in each of the plurality of alignment regions 43. It is noted that in other examples an alignment region 43 may be provided outside the mesa portion 41 or may be provided in the pattern region 42. With such a template 30, a pattern can be transferred to the resist by pressing the patterned lower surface of the mesa portion 41 against the resist dropped or coated on the substrate 10.

Figure 3:
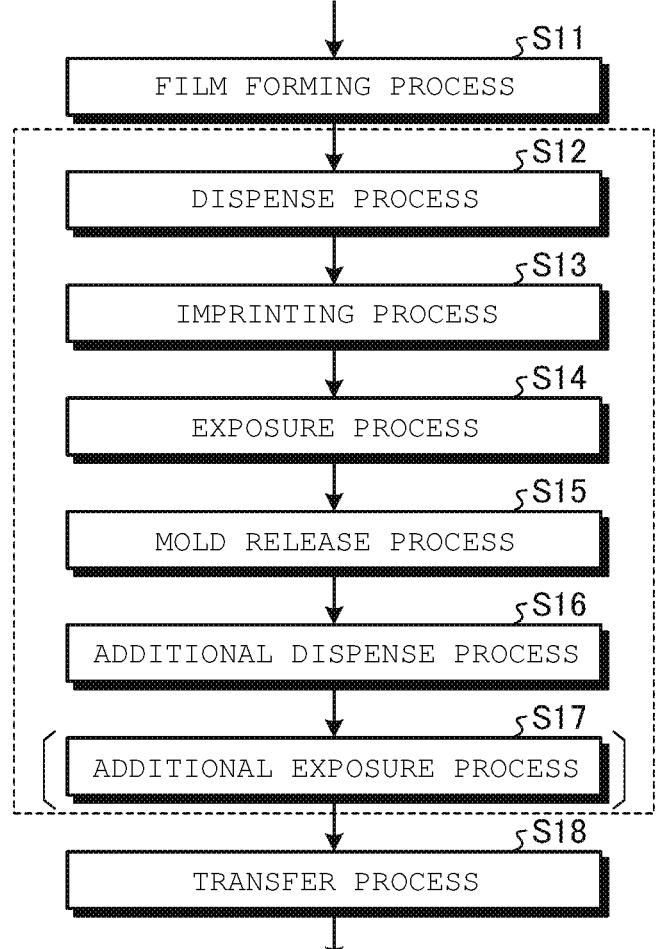
FIG. 3 is a flowchart illustrating a process flow when the pattern forming method according to the embodiment is executed.
Figure 4:
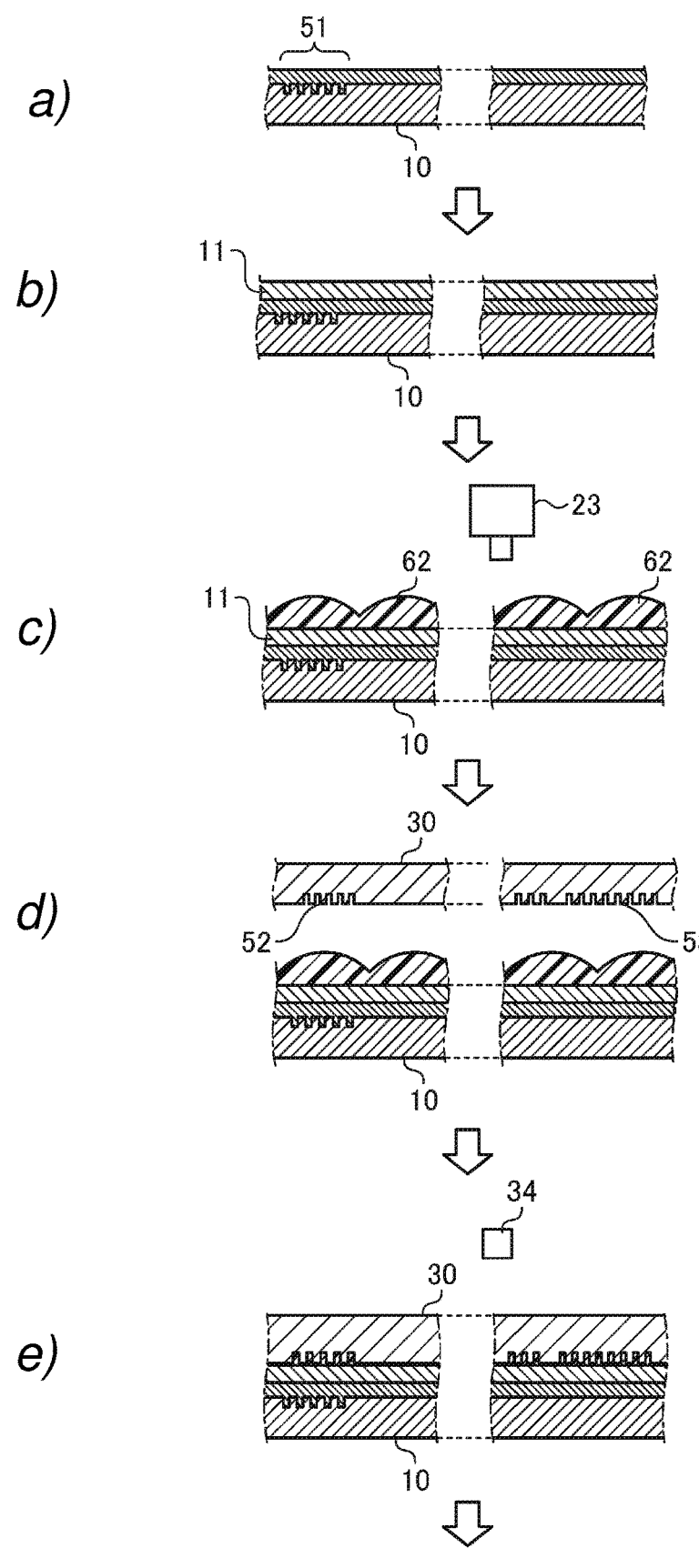
FIG. 4 is a diagram illustrating states of a substrate during a pattern forming method.
Figure 5:
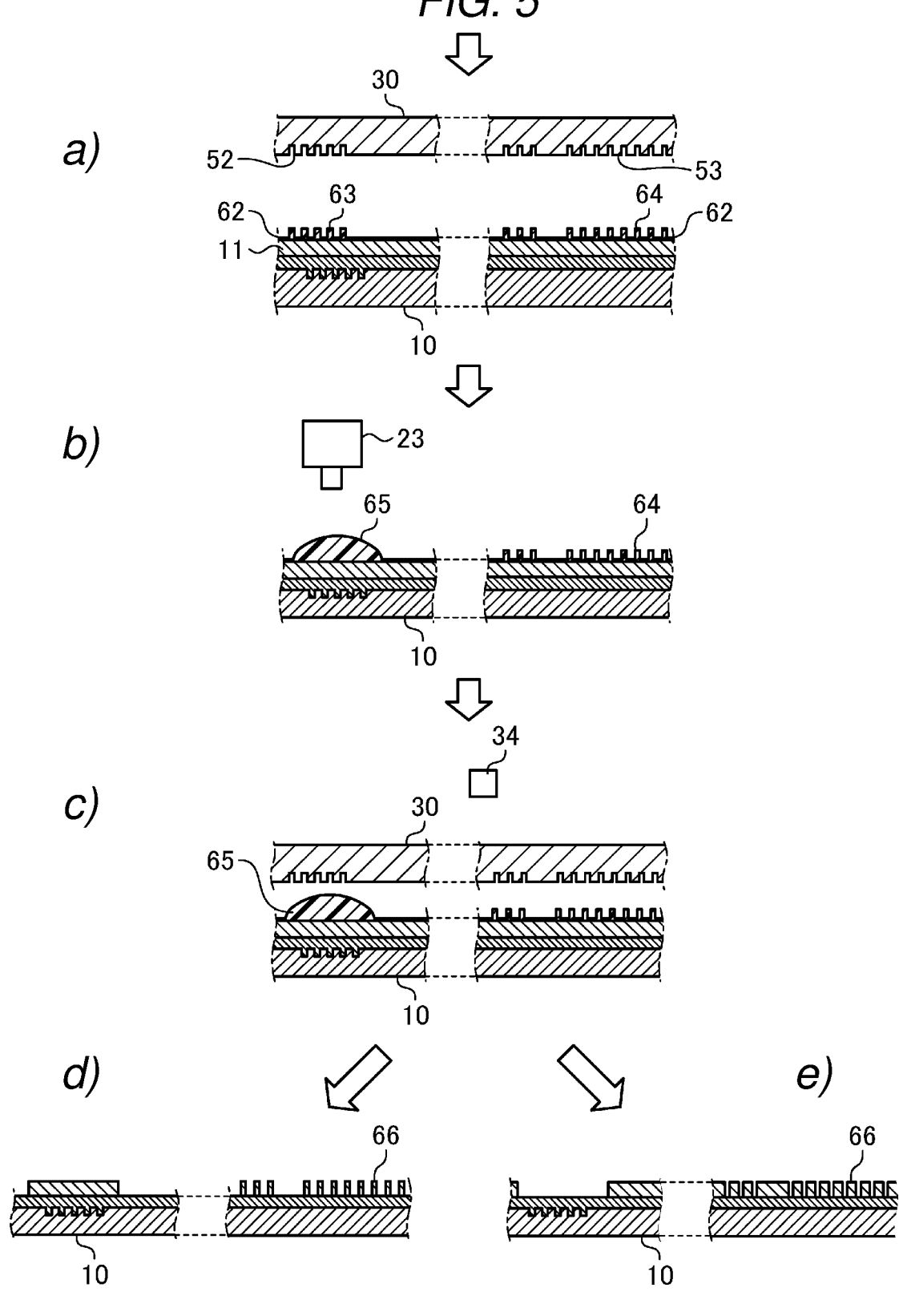
FIG. 5 is a diagram illustrating states of the substrate in a pattern forming method after the states of FIG. 4.

FIG. 3 is a flowchart illustrating a process flow when the pattern forming method according to the embodiment is executed. FIGS. 4 and 5 are diagrams illustrating the substrate 10 at various points in the pattern forming method of FIG. 3. The pattern forming method of the embodiment is performed, for example, as a part of a semiconductor device manufacturing method.

In the pattern forming method according to the embodiment, a process film 11 having a shape of a first pattern is formed on the substrate 10 according to the flow illustrated in FIG. 3.

First, in S11, a film forming process of forming the process film 11 on the substrate 10 is executed. As illustrated in FIG. 4, part a, the substrate 10 has one or the plurality of layers formed on the semiconductor substrate, and the alignment mark 51 is formed in advance at a predetermined position of the substrate 10. In this film forming process, the process film 11 is formed on the substrate 10 on which the alignment mark 51 has already been formed in advance by a film forming device as illustrated in FIG. 4, part b. The process film 11 may be an insulating material such as an oxide film or a nitride film or may be a conductive material.

The substrate 10 is unloaded from the film forming device and loaded into the pattern forming apparatus 20. In the pattern forming method according to the present embodiment, the following processes S12 to S17 are executed, for example, in the pattern forming apparatus 20.

In S12, a dropping process of dispensing a first resist 62 (first resist material) on the substrate 10 is performed. In the dropping process, the pattern forming apparatus 20 moves the substrate 10 under the dropping device 23. Subsequently, in the dropping process, as illustrated in FIG. 4, part c, the pattern forming apparatus 20 causes the dropping device 23 to drop the first resist 62 on a target shot region where a patterned process film 11 is to be formed on the substrate 10. In this context, a shot region is a region of a size that can be patterned in one imprint operation, though a plurality of chip regions (dies) may be provided within one shot region.

Subsequently, in S13, an imprinting process of pressing the template 30 against the substrate 10 with the first resist 62 is performed. In the imprinting process, the pattern forming apparatus 20 first moves the target shot region on the substrate 10 to below the template 30 as illustrated in FIG. 4, part d. The template mark 52 and the pattern 53 are formed on the lower surface of the template 30. In the imprinting process, subsequently, as illustrated in FIG. 4, part e, the pattern forming apparatus 20 presses the template 30 against the substrate 10 (more particularly, the first resist 62 thereon).

In this case, the pattern forming apparatus 20 executes the alignment process for adjusting the relative position between the substrate 10 and the template 30. More specifically, the pattern forming apparatus 20 adjusts a relative position between the substrate 10 and the template 30 so that the position of the template mark 52 formed on the template 30 matches the desired position of the alignment mark 51 on the basis of the image detected by the alignment unit 33. The pattern forming apparatus 20 executes the adjustment of the relative position between the substrate 10 and the template 30 before pressing the template 30 against the substrate 10 or during the operation of pressing the template 30 against the substrate 10. By performing such adjustment, the pattern forming apparatus 20 can align the pattern formed in advance on the substrate 10 with the pattern to be newly formed on the substrate 10 by using the template 30. By performing such an imprinting process, the template mark 52 and the pattern 53 are filled with the first resist 62 dropped on the substrate 10.

Subsequently, in S14, with the template 30 pressed against the substrate 10, an exposure process of irradiating the first resist 62 filled in the template mark 52 and the pattern 53 with light is performed. In the exposure process, the pattern forming apparatus 20 causes the light source 34 to irradiate the substrate 10 with light via the template 30. Accordingly, the first resist 62 has a higher curability or a higher solubility.

Subsequently, in S15, a mold release process of separating the template 30 from the first resist 62 is performed. In the mold release process, the pattern forming apparatus 20 separates the template 30 from the substrate 10 as illustrated in FIG. 5, part a. The first resist 62 including a first mark 63 and a first transfer pattern 64 is formed on the process film 11 on the substrate 10 after the template 30 is separated. The first mark 63 is formed at the position where the template mark 52 is pressed. The first transfer pattern 64 is formed at the position where the pattern 53 is pressed.

Subsequently, in S16, an additional dropping process of "plastering" the first mark 63 is performed by dropping an additional resist 65 at the position covering the first mark 63 in plan view of the substrate 10 on which the first resist 62 including the first mark 63 and the first transfer pattern 64 has already been formed. It is noted that, in this context, "plastering" denotes that the initial shape of the pattern or the mark disappears by filling with the (additional) resist. In the additional dropping process, the pattern forming apparatus 20 moves the substrate 10 so that the first mark 63 is located below the dropping device 23, as illustrated in FIG. 5, part b. Subsequently, in the additional dropping process, the pattern forming apparatus 20 dispenses the additional resist 65 with the dropping device 23 so as to cover the first mark 63 previously formed on the substrate 10. Accordingly, the first mark 63 formed on the substrate 10 is said to be plastered with the additional resist 65 by being filled in or covered.

Subsequently, in S17, when the additional resist 65 is a negative resist in which the portion irradiated with light is cured and remains after exposure as a mask, an additional exposure process of irradiating the additional resist 65 with light is performed after plastering the first mark 63. It is noted that, when the additional resist 65 is a positive resist in which the portion irradiated with light becomes highly soluble and the portion not irradiated with light remains as a mask, the additional exposure process of S17 is not performed. In the additional exposure process, as illustrated in FIG. 5, part c, the pattern forming apparatus 20 moves the region of the substrate 10 on which the additional resist 65 has been dropped to below the template 30. Subsequently, in the additional exposure process, the pattern forming apparatus 20 causes the light source 34 to irradiate the additional resist 65 with light via the template 30, for example. Accordingly, the additional resist 65 can be allowed to function as a mask when the process film 11 is later etched. It is noted that the light irradiation in this process may be performed without the template 30 interposed.

It is noted that, since an area of the lower surface of the template 30 is smaller than that of the surface of the substrate 10, in the pattern forming method according to the embodiment, the processes from S12 to S17 are executed for each of the plurality of shot regions on the substrate 10. Further, when the pattern forming apparatus 20 executes the processes S12 to S17 for each of the plurality of regions, some of the processes may be executed for the predetermined regions in a collective manner.

When all the processes from S12 to S17 are completed, the substrate 10 is unloaded from the pattern forming apparatus 20.

Subsequently, in S18, a transfer process of patterning the process film 11 to have a shape of the first pattern by etching the process film 11 by using the first resist 62 (including the first transfer pattern 64 and the additional resist 65) as masks is performed. In the embodiment, the transfer process of forming a circuit pattern 66 as an example of the first pattern is performed. In the transfer process, on the substrate 10 on which the first resist 62 including the first transfer pattern 64 and the additional resist 65 are formed on the process film 11, the process film 11 is etched by using the first resist 62 including the first transfer pattern 64 and the additional resist 65 as masks by an etching device. It is noted that, in the transfer process, as illustrated in FIG. 5, part d, the region other than the region where the first resist 62 and the additional resist 65 are formed in the process film 11 is removed by etching. Further, in the transfer process, when an inversion process is performed, as illustrated in FIG. 5, part e, the regions of the process film 11 in which the first resist 62 and the additional resist 65 are formed are removed by etching. It is noted that the circuit pattern may be formed by embedding the conductor such as a metal in the first pattern formed on the process film 11. Through the above-described process, it is possible to manufacture the semiconductor device having the circuit pattern.

In the pattern forming method according to the embodiment, by performing each process of the above-described flow, the process film 11 having the first pattern can be formed on the substrate 10 without leaving the pattern due to the template mark 52.

Figure 6:
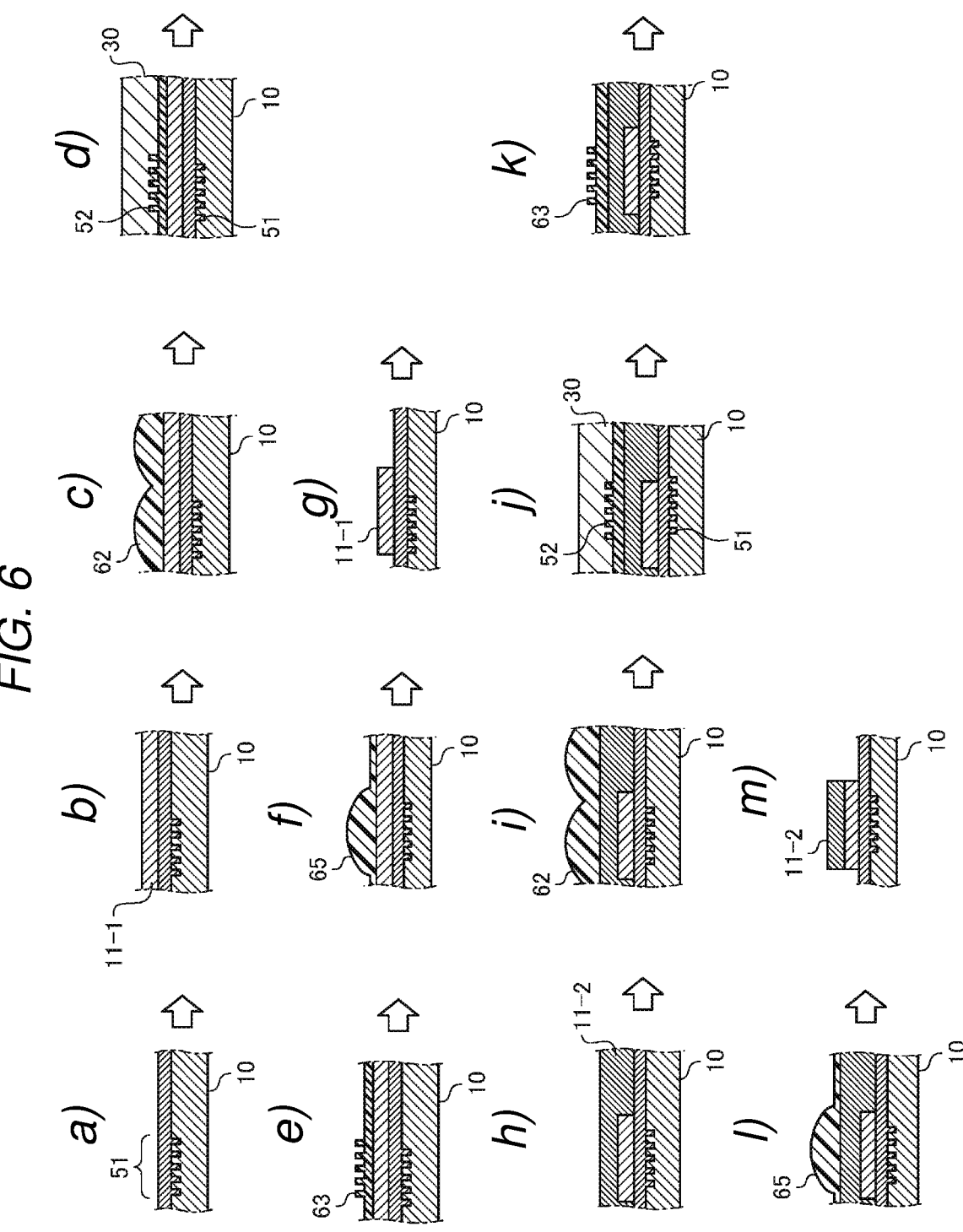
FIG. 6 is a diagram illustrating a first example of states of a substrate in a case of forming two process films.

FIG. 6 illustrates a first example of the substrate 10 in respective processes when a predetermined pattern is formed on two films (first process film 11-1 and second process film 11-2) as the process films 11 in the embodiment. It is noted that FIG. 6 depicts the region of the substrate 10 where the alignment mark 51 is formed in the transfer process.

FIG. 6 illustrates the process of forming a predetermined pattern on the first process film 11-1 and the state of the substrate 10 during the process. The process of forming the predetermined pattern on the first process film 11-1 and the state of the substrate 10 are the same as the process illustrated in FIG. 3 and the state of the substrate 10 illustrated in FIGS. 4 and 5. Therefore, additional description of each process up to FIG. 6, part g will be omitted.

Subsequently, the film forming process is performed, and as illustrated in FIG. 6, part h, the second process film 11-2 is formed on the substrate 10 after the pattern is formed on the first process film 11-1. Subsequently, as illustrated in FIG. 6, part i, the dropping process is performed, and the first resist 62 is dropped (dispensed) onto the second process film 11-2.

Subsequently, as illustrated in FIG. 6, part j, the imprinting process is performed, and the template 30 is pressed against the substrate 10 onto which the first resist 62 has been dropped. In this case, the relative position between the substrate 10 and the template 30 are adjusted so that the position of the alignment mark 51 formed on the substrate 10 matches the position of the template mark 52 formed on the template 30. It is noted that the alignment mark 51 formed on the substrate 10 is also used when the pattern is formed on the first process film 11-1. Subsequently, with the template 30 pressed against the substrate 10, the exposure process is performed, and the first resist 62 is irradiated with light.

Subsequently, a separation process is performed, and the template 30 is separated from the substrate 10. As illustrated in FIG. 6, part k, the first mark 63 is formed in the region on which the template mark 52 is pressed on the second process film 11-2 on the substrate 10 after the template 30 is separated.

Subsequently, as illustrated in FIG. 6, part 1, an additional dropping process is performed, and the additional resist 65 is dispensed at the position covering the first mark 63. Accordingly, the first mark 63 formed on the second process film 11-2 is "plastered" (that is, additionally covered with the resist 65).

Subsequently, if the additional resist 65 is a negative resist (negative tone resist), the additional exposure process is performed, and the additional resist 65 is irradiated with light. When the additional resist 65 is a positive resist (positive tone resist), no additional exposure process is performed.

Subsequently, as illustrated in FIG. 6, part m, the transfer process is performed, and the second process film 11-2 is etched by using the additional resist 65 as a mask. As described above, in the pattern forming method according to the embodiment, the first process film 11-1 having a predetermined pattern can be formed on the substrate 10, and further, the second process film 11-2 having a predetermined pattern can be formed on the first process film 11-1.

Figure 7:
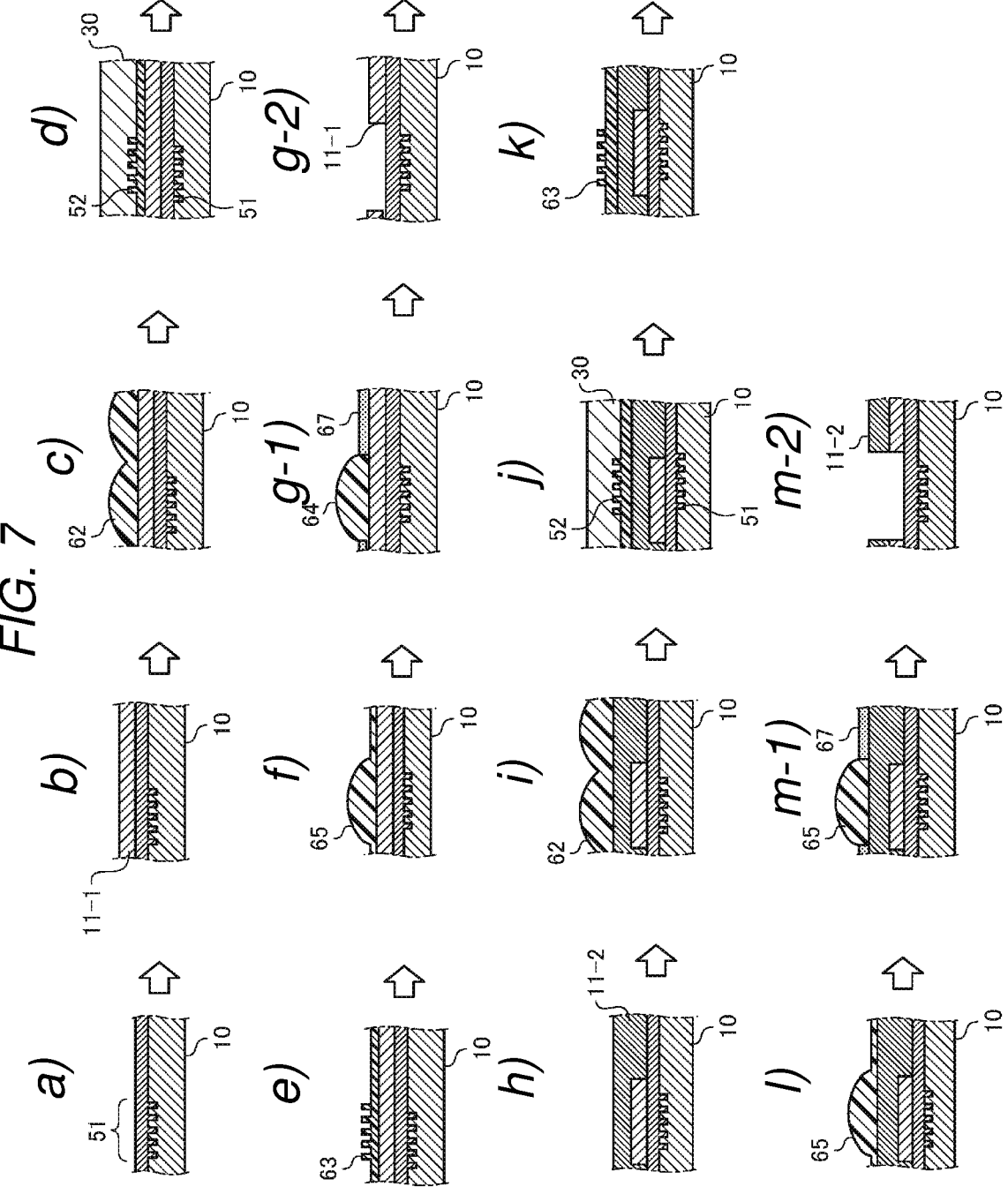
FIG. 7 is a diagram illustrating a second example of states of a substrate in a case of forming the two process films.

FIG. 7 illustrates a second example of the substrate 10 in the respective processes when a predetermined pattern is formed on two films (first process film 11-1 and second process film 11-2) as the process films 11 in the embodiment. It is noted that FIG. 7 illustrates the state of a portion of the substrate 10 on which the alignment mark 51 is formed when the inversion process is performed in the transfer process. Therefore, the processes other than the transfer process and the state of the substrate 10 are the same as those in FIG. 6. That is, FIG. 7, parts a-f and FIG. 7, parts h-l are the same as in FIG. 6, part a-f and FIG. 6, part h-l.

When the transfer process is performed on the first process film 11-1, as illustrated in FIG. 7, part g-1, a reflective material 67 such as carbon is formed as a film in the portion where the first resist 62 and the additional resist 65 are not present. Then, as illustrated in FIG. 7, part g-2, the first process film 11-1 is etched by using the reflective material 67 as a mask.

Similarly, when the transfer process is performed on the second process film 11-2, as illustrated in FIG. 7, part m-1, the reflective material 67 such as carbon is formed as a film in the portion where the first resist 62 and the additional resist 65 are not present. Then, as illustrated in FIG. 7, part g-2, the second process film 11-2 is etched by using the reflective material 67 as a mask. As described above, in the pattern forming method according to the embodiment, the first process film 11-1 having a predetermined pattern can be formed on the substrate 10 by using the transfer process by the inversion process, and further, the second process film 11-2 having a predetermined pattern can be formed on the process film 11-1.

As illustrated in FIGS. 6 and 7, in the pattern forming method according to the embodiment, when a predetermined pattern is formed on the plurality of process films 11, the alignment process can be performed by using a common alignment mark 51. Accordingly, according to the pattern forming method according to the embodiment, the alignment marks 51 can be efficiently used without forming the plurality of alignment marks 51 on the substrate 10. Further, according to the pattern forming method according to the embodiment, a dead space in which a substantial pattern cannot be formed on the substrate 10 can be reduced, and the pattern layout of the substrate 10 can be efficiently designed.

Figure 8:
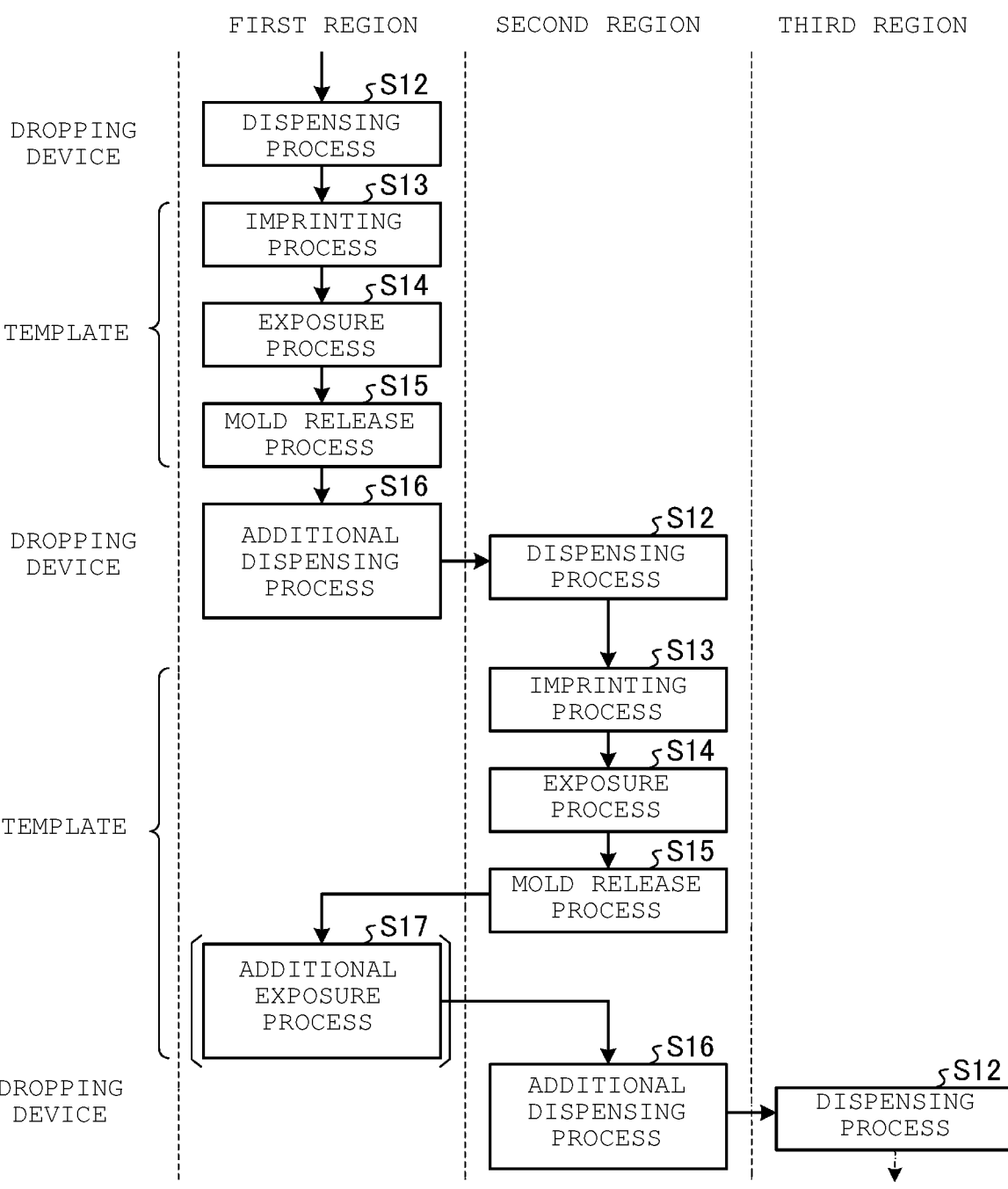
FIG. 8 is a flowchart illustrating a first example of the process flow of the pattern forming apparatus.

FIG. 8 is a flowchart illustrating a first example of the process flow of the pattern forming apparatus 20 in the pattern forming method of the embodiment. When forming the resist including the transfer pattern for each of the plurality of shot regions on the substrate 10, the pattern forming apparatus 20 executes each process, for example, in the flow illustrated in FIG. 8.

First, the pattern forming apparatus 20 moves the first region of one of the plurality of shot regions on the substrate 10 below the dropping device 23, and executes the dropping process (S12) on the first region. Subsequently, the pattern forming apparatus 20 moves the first region below the template 30 and executes the imprinting process (S13), the exposure process (S14), and the mold release process (S15) on the first region.

Subsequently, the pattern forming apparatus 20 moves the first region below the dropping device 23, and executes the additional dropping process (S16) on the first region. Subsequently, the pattern forming apparatus 20 moves the second region of one of the plurality of shot regions below the dropping device 23 and executes the dropping process (S12) on the second region. Herein, when the first region and the second region are close to each other, the pattern forming apparatus 20 may execute the additional dropping process (S16) for the first region and the dropping process (S12) for the second region without moving the substrate 10. These processes (S16 and S12) may thus be performed at the same time in some examples. The case of being close to each other includes, for example, the case of the shot region where the first region and the second region are adjacent to each other.

Subsequently, the pattern forming apparatus 20 moves the second region below the template 30 and executes the imprinting process (S13), the exposure process (S14), and the mold release process (S15) on the second region. Subsequently, the pattern forming apparatus 20 moves the first region below the template 30 and executes the additional exposure process (S17) on the first region. It is noted that, when the resist is a positive resist, the pattern forming apparatus 20 does not execute the additional exposure process (S17).

Subsequently, the pattern forming apparatus 20 moves the second region below the dropping device 23 and executes the additional dropping process (S16) on the second region. Subsequently, the pattern forming apparatus 20 moves a third region of one of the plurality of shot regions below the dropping device 23 and executes the dropping process (S12) on the third region. When the second region and the third region are close to each other, the pattern forming apparatus 20 may execute the additional dropping process (S16) for the second region and the dropping process (S12) for the third region together without moving the substrate 10.

Then, subsequently, the pattern forming apparatus 20 executes the process in the same flow (sequence) as the first region and the second region for the second region and the third region. Further, the pattern forming apparatus 20 executes the process in the same flow (sequence) for the fourth and subsequent regions.

By executing each process in such a flow (sequence), the pattern forming apparatus 20 can execute the dropping process (S12) and the additional dropping process (S16) on two adjacent regions without moving the substrate 10. Accordingly, the pattern forming apparatus 20 can shorten the time required for moving the substrate 10 and form the pattern in s shorter time.

Figure 9:
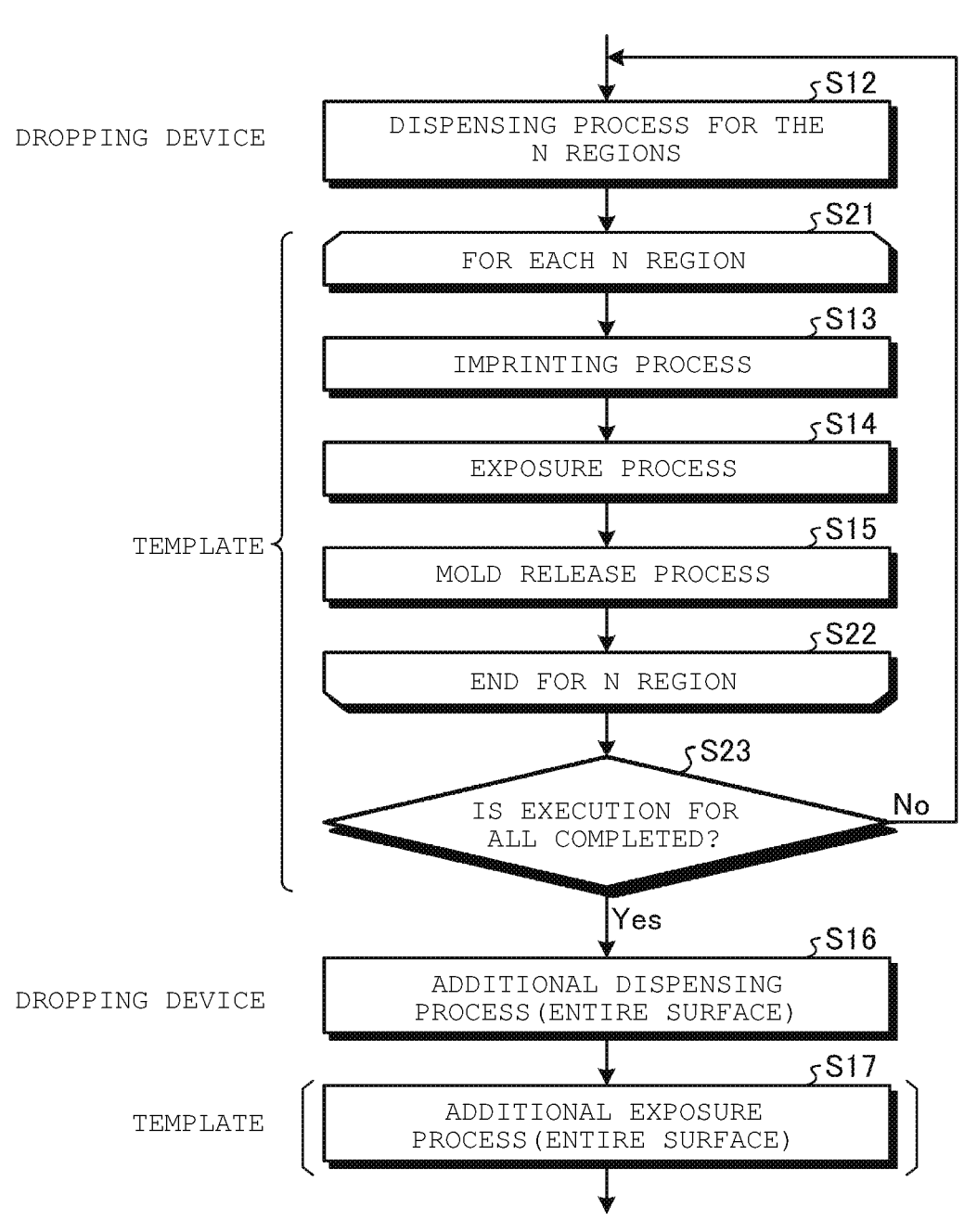
FIG. 9 is a flowchart illustrating a second example of the process flow of the pattern forming apparatus.

FIG. 9 is a flowchart illustrating a second example of the process flow of the pattern forming apparatus 20 in the pattern forming method of the embodiment. When the resist including the transfer pattern is formed for each of the plurality of shot regions on the substrate 10, the pattern forming apparatus 20 may execute each process in the flow illustrated in FIG. 9.

First, the pattern forming apparatus 20 selects N regions (N is an integer of 2 or more) among the plurality of shot regions on the substrate 10 and sequentially moves each of the selected N regions below the dropping device 23, and the dropping process (S12) is continuously executed for each of the N regions. When the N regions are in close proximity, the pattern forming apparatus 20 may not move the substrate 10 during the period in which the dropping process (S12) is executed for the selected N regions.

Subsequently, the pattern forming apparatus 20 sequentially executes the processes of S13 to S15 for each of the N regions (loop processes between S21 and S22). That is, the pattern forming apparatus 20 moves the corresponding region below the template 30 for each of the N regions, and the imprinting process (S13), the exposure process (S14), and the mold release process (S15) are executed on the corresponding region.

Subsequently, the pattern forming apparatus 20 determines whether the execution of the processes S12 to S15 is completed for all of the plurality of regions on the substrate 10 (S23). When the execution of the processes S12 to S15 is not completed for all of the plurality of regions on the substrate 10 (No in S23), the pattern forming apparatus 20 returns processing to S12 to select new N regions and repeats processing from S12.

When the execution of the processes S12 to S15 is completed for all of the plurality of regions on the substrate 10 (Yes in S23), the pattern forming apparatus 20 executes the additional dropping process (S16) for the plurality of regions on the substrate 10. That is, the pattern forming apparatus 20 executes the additional dropping process (S16) on the entire surface of the substrate 10.

Subsequently, the pattern forming apparatus 20 executes the additional exposure process (S17) on the plurality of regions on the substrate 10 at the same time. That is, the pattern forming apparatus 20 executes the additional exposure process (S16) on the entire surface of the substrate 10. It is noted that, when the resist is a positive resist, the pattern forming apparatus 20 does not execute the additional exposure process (S17).

By executing each process in the flow, the pattern forming apparatus 20 can perform the process of plastering the first mark 63 by further dropping the additional resist 65 at the position covering the first mark 63 with a small amount of movement of the substrate 10. Accordingly, the pattern forming apparatus 20 can shorten the time required for moving the substrate 10 and form the pattern in a shorter time.

FIG. 10 is a flowchart illustrating a process flow when the pattern forming method according to Modified Example of the first embodiment is executed. In the pattern forming method according to Modified Example of the first embodiment, a coating process (S31) is performed instead of the dropping process (S12).

In the coating process (S31), the entire surface of the substrate 10 on which the process film 11 is formed, including the plurality of shot regions, is coated with the resist by a coating device different from the pattern forming apparatus 20. Subsequently, the substrate 10 on which the entire surface is coated with the resist is loaded on the pattern forming apparatus 20. Then, the pattern forming apparatus 20 executes the imprinting process (S13), the exposure process (S14), the mold release process (S15), the additional dropping process (S16), and the additional exposure process (S17) on the substrate 10 on which the entire surface is coated with the resist. It is noted that, when the additional resist 65 is a positive resist in the additional dropping process (S16), the pattern forming apparatus 20 does not execute the additional exposure process of S17. Further, in the pattern forming method according to Modified Example, the processes S13 to S17 are executed for each of the plurality of regions on the substrate 10.

After the processes S13 to S17 are performed, the substrate 10 is unloaded from the pattern forming apparatus 20. Then, in the pattern forming method according to Modified Example, the transfer process (S18) is performed on the substrate 10 after the processes S13 to S17 are performed.

By performing the coating process (S31) instead of the dropping process (S12) in this manner, the pattern forming method according to Modified Example of the embodiment can coat the substrate 10 with the resist in one process.

FIG. 11 is a diagram illustrating an example of a process flow of the pattern forming apparatus 20 when the substrate 10 coated with the resist on the entire surface is loaded. When the substrate 10 coated with the resist on the entire surface is loaded, the pattern forming apparatus 20 executes, for example, each process in the flow illustrated in FIG. 11.

First, the pattern forming apparatus 20 selects any one target region among the plurality of shot regions on the substrate 10 (S41). Subsequently, the pattern forming apparatus 20 executes the imprinting process (S13), the exposure process (S14), and the mold release process (S15) on the selected target region. Subsequently, the pattern forming apparatus 20 determines whether the execution of the processes S13 to S15 is completed for all of the plurality of shot regions on the substrate 10 (S42). When the execution of the processes of S13 to S15 is not completed for all of the plurality of regions on the substrate 10 (No in S42), the pattern forming apparatus 20 returns processing to S41 to select a new target region where the processes of S13 to S15 are not executed and repeats processing from S13.

When the processes S13 to S15 are completed for all of the plurality of shot regions on the substrate 10 (Yes in S42), the pattern forming apparatus 20 executes the additional dropping process (S16) for the plurality of shot regions on the substrate 10 at the same time. That is, the pattern forming apparatus 20 executes the additional dropping process (S16) on the entire surface of the substrate 10.

Subsequently, the pattern forming apparatus 20 executes the additional exposure process (S17) on the plurality of regions on the substrate 10 at the same time. It is noted that, when the additional resist 65 is a positive resist, the pattern forming apparatus 20 does not need to execute an additional exposure process (S17).

By executing each process in such a flow, the pattern forming apparatus 20 can perform the process of plastering the first mark 63 by further dropping the resist at the position covering the first mark 63 with a small amount of movement of the substrate 10. Accordingly, the pattern forming apparatus 20 can shorten the time required for moving the substrate 10 and efficiently form the pattern.

Figure 12:
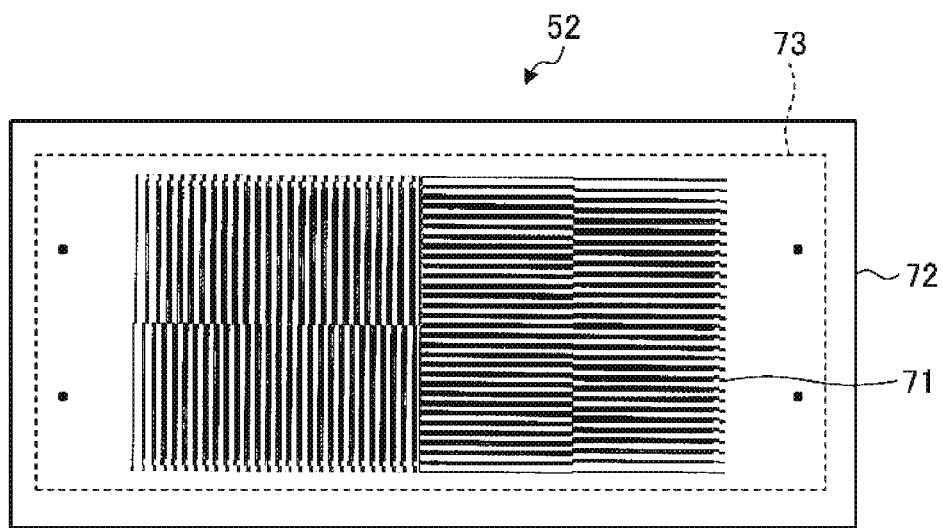
FIG. 12 is a diagram illustrating an example of a template mark.

FIG. 12 is a diagram illustrating an example of the template mark 52. The template mark 52 is formed in each of the plurality of alignment regions 43 in the template 30.

The template mark 52 includes a main pattern 71 and an auxiliary pattern 72. The main pattern 71 is used for alignment with the alignment mark 51 in the alignment process. The main pattern 71 is formed in, for example, a recess region 73 recessed from the surroundings.

The auxiliary pattern 72 is the groove surrounded a periphery of the main pattern 71. For example, the auxiliary pattern 72 is formed outside the recess region 73.

The template mark 52 has the auxiliary pattern 72, so that when the additional resist 65 is dropped on the first mark 63 formed by pressing the template mark 52, it is possible to prevent the resist from spreading to regions other than the region of the first mark 63. In the pattern forming method according to the embodiment, by performing the alignment process using such a template mark 52, it is possible to prevent the unintended portion from being plastered in the additional dropping process.

Further, in the template mark 52, the main pattern 71 is formed in the recess region 73, and the auxiliary pattern 72 is formed outside the recess region 73. In the pattern forming method according to the embodiment, by performing the alignment process using such a template mark 52, it is possible to reduce the noise due to the auxiliary pattern 72 provided in the image illustrating the deviation between the alignment mark 51 and the template mark 52.

As described above, in the pattern forming method according to the first embodiment, the resist including the transfer pattern corresponding to the first pattern and the first mark 63 is formed on the substrate 10 on which the process film 11 has already been formed. Subsequently, in the pattern forming method according to the first embodiment, by further dropping the resist at the position covering the first mark 63 on the substrate 10, the first mark 63 is plastered.

Accordingly, in the pattern forming method according to the first embodiment, when the alignment process is performed by using the alignment mark 51 already formed on the substrate 10 and the template mark 52 formed on the template 30, it is possible to plaster the first mark 63 which corresponds to the template mark 52 and is already formed on the substrate 10. Therefore, in the pattern forming method according to the first embodiment, when the plurality of process films 11 having a predetermined pattern is formed, the alignment process can be performed by using a common alignment mark 51. Accordingly, according to the pattern forming method according to the first embodiment, the alignment mark 51 formed on the substrate 10 can be efficiently used. Then, according to the pattern forming method according to the first embodiment, a dead space in which the substantial pattern cannot be formed on the substrate 10 can be reduced, and the layout of the substrate 10 can be more efficiently designed.

It is noted that in some examples the first mark 63 may not be a mark that is formed by pressing the template mark 52. For example, the first mark 63 may be a portion provided in the transfer pattern formed on the substrate 10. In the pattern forming method according to the first embodiment, after the same transfer pattern is formed by using the same template 30 for each of the plurality of regions, a portion of the transfer pattern formed in the plurality of regions can be plastered. Accordingly, in the pattern forming method according to the first embodiment, a transfer pattern for which a portion of the pattern is made different for each of the plurality of regions even though the same template 30 is used for each.

Second Embodiment

Next, a pattern forming method according to a second embodiment will be described. In the pattern forming method according to the second embodiment, a process film 11 having a first pattern is formed on a substrate 10 by using a technique of photolithography. It is noted that, in describing the second embodiment, members having substantially the same configurations and functions as the components described in the first embodiment are denoted by the same reference numeral, and detailed description thereof will be omitted.

Figure 13:
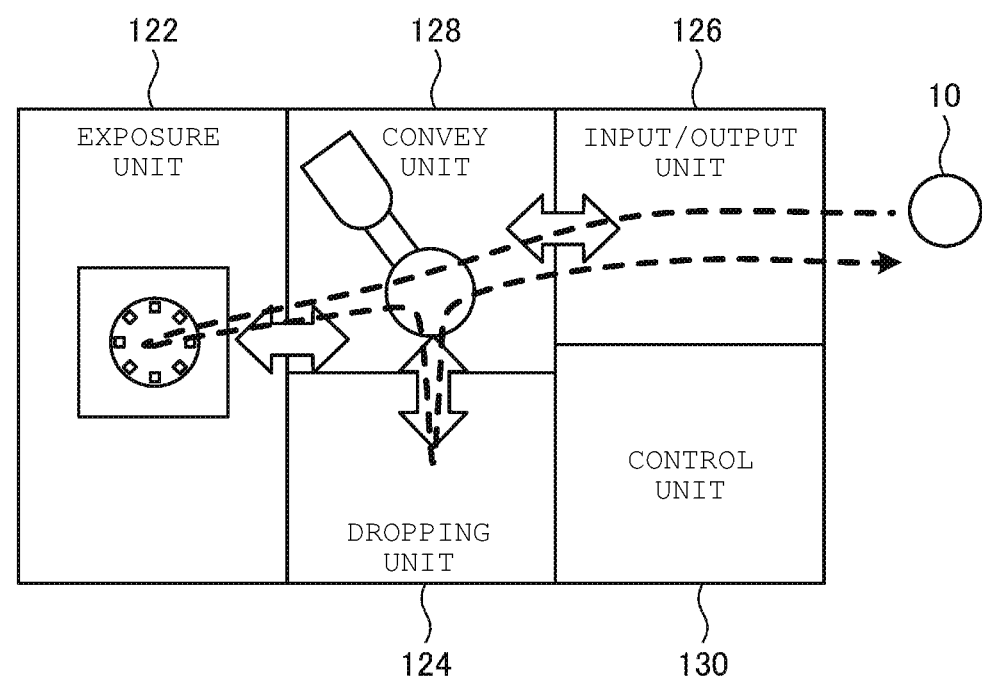
FIG. 13 is a diagram illustrating a configuration of a pattern forming apparatus according to a second embodiment.

FIG. 13 is a diagram illustrating a configuration of a pattern forming apparatus 110 according to the second embodiment. In the pattern forming method according to the second embodiment, the process film 11 having a shape of the first pattern can be formed on the substrate 10. The pattern forming apparatus 110 forms an exposed resist pattern including the transfer pattern corresponding to the shape of the first pattern is on the process film 11 by using photolithography.

The pattern forming apparatus 110 includes an exposure unit 122, a dropping unit 124, an input/output unit 126, a convey unit 128, and a control unit 130.

By irradiating the substrate 10 coated with the resist with light via a photomask (which is a type of an original plate), the exposure unit 122 forms a resist pattern having the transfer pattern portion corresponding to the first pattern on the substrate 10. Further, the exposure unit 122 aligns the photomask with the substrate 10 before the formation of the resist pattern. The alignment mark 51 is formed on the substrate 10. Further, the template mark 52 is formed on the photomask. For example, the exposure unit 122 images the alignment mark 51 formed on the substrate 10 and the template mark 52 formed on the photomask and thus adjusts the relative position between the substrate 10 and the photomask. By including the exposure unit 122, the pattern forming apparatus 110 can execute the photolithographic exposure process.

The dropping unit 124 dispenses the resist as droplets onto the upper surface of the substrate 10. The dropping unit 124 has the same configuration as the dropping device 23 according to the first embodiment. By including the dropping unit 124, the pattern forming apparatus 110 can execute the additional dropping process of dispensing the resist onto the substrate 10.

The input/output unit 126 receives the substrate 10 coated with the resist from an external device. Further, the input/output unit 126 passes the substrate 10 with the exposed resist pattern formed on the process film 11 to the external device.

The convey unit 128 conveys the substrate 10 within the pattern forming apparatus 110. For example, under the control of the control unit 130, the convey unit 128 passes the substrate 10 received by the input/output unit 126 to the exposure unit 122, passes the substrate 10 exposed by the exposure unit 122 to the dropping unit 124, and passes the substrate 10 on which the resist has been dispensed by the dropping unit 124 to the input/output unit 126. The convey unit 128 may be or include a robotic arm or the like.

The control unit 130 controls the exposure unit 122, the dropping unit 124, the input/output unit 126, and the convey unit 128. The control unit 130 has, for example, an information processing function having a processor, and executes a program. The control unit 130 controls the execution order of the exposure process and the additional dropping process by operating according to the program.

It is noted that, in the dropping unit 124, when a negative resist in which the portion irradiated with light becomes cured and remains as a mask is used, the pattern forming apparatus 110 may separately include an irradiation device for irradiating the negative resist with light. Accordingly, the pattern forming apparatus 110 can execute the additional exposure process.

Further, the pattern forming apparatus 110 may include a pre-alignment device that roughly adjusts the position of the substrate 10. When the pattern forming apparatus 110 includes the pre-alignment device, the convey unit 128 passes the substrate 10 received by the input/output unit 126 to the pre-alignment device and passes the substrate 10 of which position is roughly adjusted by the pre-alignment device to the exposure unit 122.

FIG. 14 is a flowchart illustrating a process flow when a pattern forming method according to a first example of the second embodiment is executed. In the pattern forming method according to the first example of the second embodiment, the process film 11 having the first pattern is formed on the substrate 10 by the flow illustrated in FIG. 14.

First, in S51, a coating process of coating the entire surface of the substrate 10, on which the process film 11 has already been formed, with the negative resist is performed.

Subsequently, in S52, an exposure process of exposing the substrate 10 (coated with the negative resist on the entire surface) via the photomask to form the exposed resist pattern including the transfer pattern and the first mark 63 is performed. The exposure process is executed by the pattern forming apparatus 110. It is noted that, in this example, the exposure process may be executed by devices other than the pattern forming apparatus 110.

Subsequently, in S53, curing and developing processes are performed on the substrate 10 on which the exposure process has been executed. Accordingly, the mask including the transfer pattern and the first mark 63 is formed.

Subsequently, in S54, an additional dropping process of further dropping the negative resist is performed at the position covering the first mark 63 on the substrate 10. It is noted that, in this example, the additional dropping process may be executed by the dropping unit 124 in the pattern forming apparatus 110 or may be executed by a device separate from the pattern forming apparatus 110.

Subsequently, in S55, an additional exposure process of irradiating the negative resist dropped at the position covering the first mark 63 with light to cure the negative resist is performed. The exposure process may be executed by the pattern forming apparatus 110 or may be executed by a separate device.

Subsequently, in S56, a transfer process of forming the process film 11 having a shape of the first pattern on the substrate 10 is performed by etching the process film 11 by using the resist as a mask.

In the pattern forming method according to the first example, the process film 11 having a shape of the first pattern can be formed on the substrate 10 by performing each process of the above-described flow.

FIG. 15 is a flowchart illustrating a process flow when a pattern forming method according to a second example of the second embodiment is executed. In the pattern forming method according to the second example of the second embodiment, the process film 11 having the first pattern is formed on the substrate 10 by the flow illustrated in FIG. 15.

First, in S61, a coating process of coating the entire surface of the substrate 10, on which the process film 11 is already formed, with the positive resist is performed.

Subsequently, in S62, an exposure process of exposing the substrate 10 (coated with the positive resist) via the photomask to form a resist pattern having a high solubility in the portion including the transfer pattern and the first mark 63 is performed.

Subsequently, in S63, an additional dropping process of further dispensing a positive resist is performed at the position covering the first mark 63 on the substrate 10.

It is noted that, in the second example, the exposure process and the additional dropping process are executed in the pattern forming apparatus 110. When the processes of S62 and S63 are executed, the control unit 130 of the pattern forming apparatus 110 controls the convey unit 128 to convey the substrate 10 (coated with the positive resist on the entire surface) to the exposure unit 122. Subsequently, the control unit 130 controls the exposure unit 122 to form the resist pattern of which the portion including the transfer pattern and the first mark 63 has a high solubility on the substrate 10 on which the process film 11 by photolithography. Subsequently, the control unit 130 controls the convey unit 128 to convey the substrate 10 (with the exposed resist pattern thereon) from the exposure unit 122 to the dropping unit 124. Subsequently, the control unit 130 controls the dropping unit 124 to plaster the first mark 63 by further dispensing positive resist at the position covering the first mark 63 on the substrate 10. Then, the control unit 130 unloads the substrate 10 on which the first mark 63 has been plastered from the pattern forming apparatus 110.

Subsequently, in S64, curing and developing processes are performed on the substrate 10 on which the exposure process and the additional dropping process was executed. Accordingly, the mask including the transfer pattern is formed. Subsequently, in S65, a transfer process of patterning the process film 11 to have a shape of the first pattern is performed on the substrate 10 by etching the process film 11 by using the resist as a mask.

In the pattern forming method according to the second example, the process film 11 having a shape of the first pattern can be formed on the substrate 10 by performing each process of the above-described flow.

Figures 16, 17:
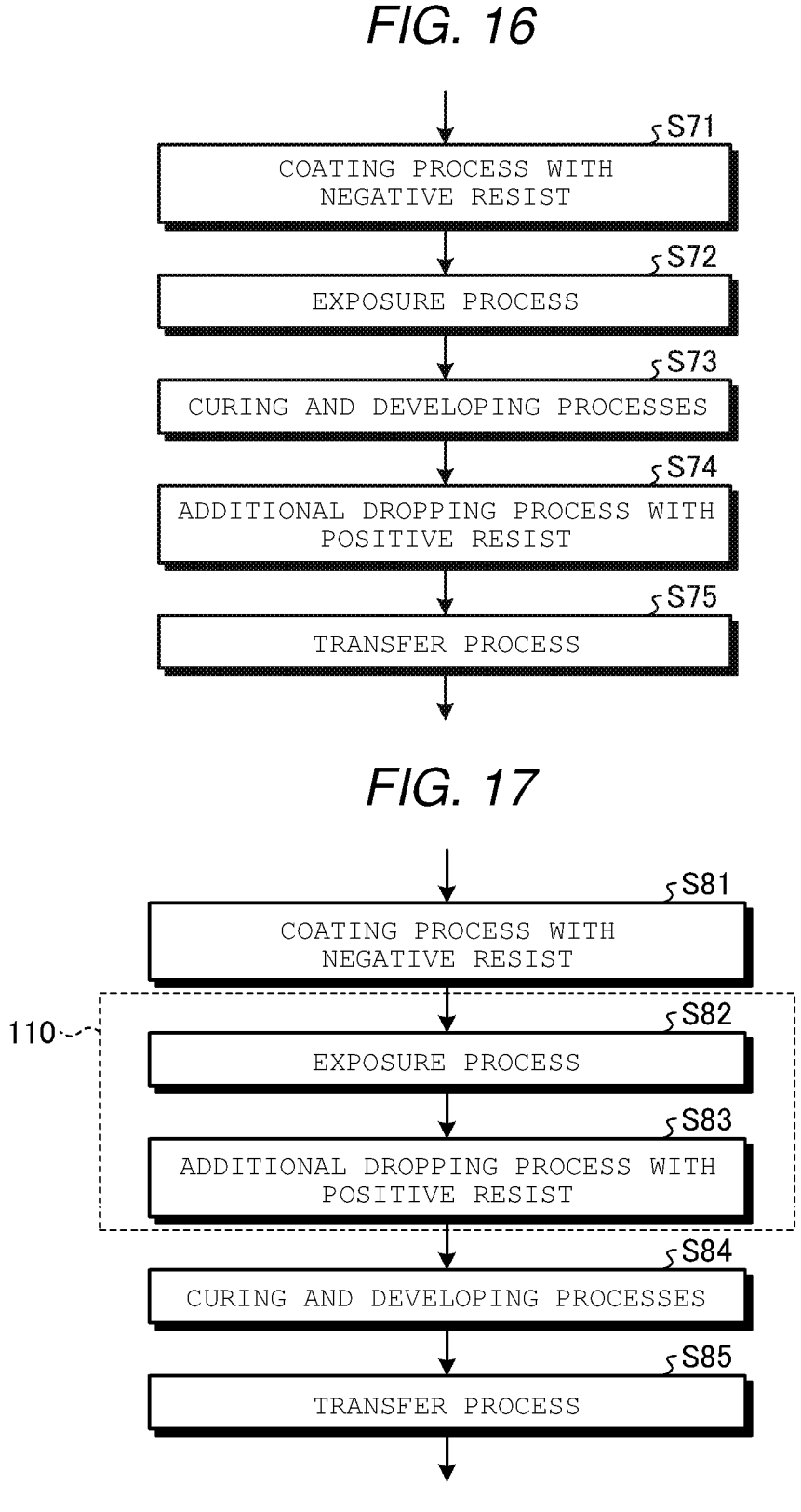
FIG. 16 is a flowchart illustrating a process flow when a pattern forming method according to a third example of the second embodiment is executed.
FIG. 17 is a flowchart illustrating a process flow when a pattern forming method according to a fourth example of the second embodiment is executed.

FIG. 16 is a flowchart illustrating a process flow when a pattern forming method according to a third example of the second embodiment is executed. In the pattern forming method according to the third example of the second embodiment, the process film 11 having a shape of the first pattern is formed on the substrate 10 by the flow illustrated in FIG. 16.

First, in S71, a coating process of coating the entire surface of the substrate 10, on which the process film 11 has already been formed, with the negative resist is performed.

Subsequently, in S72, an exposure process of exposing the substrate 10 (coated with the negative resist on the entire surface) via the photomask to form the exposed resist pattern including the transfer pattern and the first mark 63 is performed. The exposure process is executed by the pattern forming apparatus 110. It is noted that, in the third example, the exposure process may be executed by a device without a dropping unit 124.

Subsequently, in S73, curing and developing processes are performed on the substrate 10 on which the exposure process is executed. Accordingly, the mask including the transfer pattern and the first mark 63 is formed.

Subsequently, in S74, an additional dropping process of further dispensing the positive resist is performed at the position covering the first mark 63 on the substrate 10. It is noted that, in the third example, the additional dropping process may be executed by the dropping unit 124 in the pattern forming apparatus 110 or may be executed by a device separate from the pattern forming apparatus 110. Subsequently, in S75, a transfer process of patterning the process film 11 to have a shape of the first pattern on the substrate 10 is performed by etching the process film 11 by using the resist as a mask.

In the pattern forming method according to the third example, the process film 11 having a shape of the first pattern can be formed on the substrate 10 by performing each process of the above-described flow.

FIG. 17 is a flowchart illustrating a process flow when a pattern forming method according to a fourth example of the second embodiment is executed. In the pattern forming method according to the fourth example of the second embodiment, the process film 11 having a shape of the first pattern is formed on the substrate 10 by the flow illustrated in FIG. 17.

First, in S81, a coating process of coating the entire surface of the substrate 10, on which the process film 11 is formed, with the negative resist is performed.

Subsequently, in S82, an exposure process of exposing the substrate 10 (coated with the negative resist on the entire surface) via the photomask to form an exposed resist in which the portion including the transfer pattern and the first mark 63 has been cured is performed.

Subsequently, in S83, an additional dropping process of further dispensing positive resist is performed at the position covering the first mark 63 on the substrate 10.

It is noted that, in the fourth example, the exposure process and the additional dropping process are executed in the pattern forming apparatus 110. When the processes of S82 and S83 are executed, the control unit 130 of the pattern forming apparatus 110 controls the convey unit 128 to convey the substrate 10 coated with the negative resist on the entire surface to the exposure unit 122. Subsequently, the control unit 130 controls the exposure unit 122 to form the positive resist pattern including the transfer pattern and the first mark 63 on the substrate 10 by photolithography. Subsequently, the control unit 130 controls the convey unit 128 to convey the substrate 10 from the exposure unit 122 to the dropping unit 124. Subsequently, the control unit 130 controls the dropping unit 124 to plaster the first mark 63 by further dispensing positive resist at the position covering the first mark 63 on the substrate 10. Then, the control unit 130 unloads the substrate 10 on which the first mark 63 has been plastered from the pattern forming apparatus 110.

Next, in S84, curing and developing processes are performed on the substrate 10 on which the exposure process and the additional dropping process were executed. Accordingly, a mask including the transfer pattern is formed. Subsequently, in S85, a transfer process of patterning the process film 11 to have a shape of the first pattern is performed on the substrate 10 by etching the process film 11 by using the resist as a mask.

In the pattern forming method according to the fourth example, the process film 11 having a shape of the first pattern can be formed on the substrate 10 by performing each process of the above-described flow.

Figure 18:
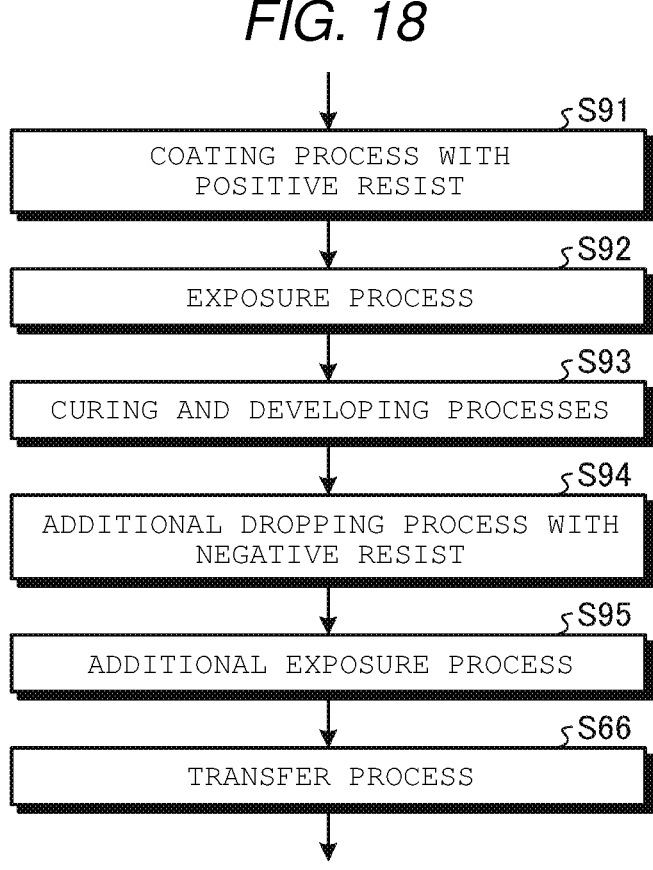
FIG. 18 is a flowchart illustrating a process flow when a pattern forming method according to a fifth example of the second embodiment is executed.

FIG. 18 is a flowchart illustrating a process flow when a pattern forming method according to a fifth example of the second embodiment is executed. In the pattern forming method according to the fifth example of the second embodiment, the process film 11 having a shape of the first pattern is formed on the substrate 10 by the flow illustrated in FIG. 18.

First, in S91, a coating process of coating the entire surface of the substrate 10, on which the process film 11 has already been formed, with the positive resist is performed.

Subsequently, in S92, an exposure process of exposing the substrate 10 (coated with the positive resist on the entire surface) via the photomask to form an exposed resist pattern in which the portion including the transfer pattern and the first mark 63 has a high solubility is performed.

Subsequently, in S93, curing and developing processes are performed on the substrate 10 on which the exposure process was executed. Accordingly, a mask including the transfer pattern and the first mark 63 is formed.

Subsequently, in S94, an additional dropping process of further dispensing negative resist is performed at the position covering the first mark 63 on the substrate 10. It is noted that, in the fifth example, the additional dropping process may be executed by the dropping unit 124 in the pattern forming apparatus 110 or may be executed by the dropping device 23 provided as a device separate from the pattern forming apparatus 110.

Subsequently, in S95, an additional exposure process of irradiating the negative resist dropped at the position covering the first mark 63 with light to cure the negative resist is performed. In the fifth example, the exposure process may be executed by the pattern forming apparatus 110 or may be executed by a separate device. Subsequently, in S96, a transfer process of patterning the process film 11 to have a shape of the first pattern is performed on the substrate 10 by etching the process film 11 by using the resist as a mask.

In the pattern forming method according to the fifth example, the process film 11 having a shape of the first pattern can be formed on the substrate 10 by performing each process of the above-described flow.

As described above, in the pattern forming method according to the second embodiment, a resist pattern including the transfer pattern and the first mark 63 is formed on the substrate 10 by photolithography. Subsequently, in the pattern forming method according to the second embodiment, by further dispensing resist at the position covering the first mark 63 on the substrate 10, the first mark 63 is plastered.

Accordingly, in the pattern forming method according to the second embodiment, when the alignment process is performed by using the alignment mark 51 already formed on the substrate 10 and the template mark 52 formed on the photomask, it is possible to plaster the first mark 63 (which corresponds to the template mark 52) already formed on the substrate 10. Therefore, in the pattern forming method according to the second embodiment, when the plurality of process films 11 having the predetermined pattern is formed, the alignment process can be performed by using a common alignment mark 51. Accordingly, according to the pattern forming method according to the second embodiment, the alignment mark 51 formed on the substrate 10 can be efficiently used. Then, according to the pattern forming method according to the second embodiment, a dead space in which the substantial pattern cannot be formed on the substrate 10 can be reduced, and the layout of the substrate 10 can be efficiently designed.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A pattern forming method, comprising:
   forming a first resin pattern on a substrate using a first resin, the first resin pattern including a first transfer pattern and a first mark;
   dispensing a second resin to cover the first mark of the first resin pattern;
   forming a first pattern including the first transfer pattern and the second resin covering the first mark; and
   transferring the first transfer pattern to a first process film on the substrate.

2. The pattern forming method according to claim 1, wherein
   the first mark is for alignment to a second mark provided on an original plate for forming the first pattern, and
   the second mark is used for aligning the original plate with the substrate.

3. The pattern forming method according to claim 2, wherein
   the substrate has an alignment mark formed thereon, and
   when the first resin pattern is formed, a relative position between the substrate and the original plate is adjusted by using the alignment mark and the second mark.

4. The pattern forming method according to claim 3, further comprising:
   after dispensing the second resin, irradiating the second resin with light.

5. The pattern forming method according to claim 4, wherein the irradiating of the first resin and the irradiating of the second resin occur in different devices.

6. The pattern forming method according to claim 1, further comprising:
   dispensing the first resin on to the substrate, wherein forming the first resin pattern on the substrate includes:
   pressing an original plate against the first resin on the substrate;
   irradiating the first resin with light while the original plate is pressed against the first resin on the substrate; and
   separating the original plate from the substrate after the irradiating of the first resin.

7. The pattern forming method according to claim 6, further comprising:
   adjusting the relative position of the substrate and the original plate before pressing the original plate against the first resin on the substrate, the adjusting being based on a first alignment mark formed in the original plate and a second alignment mark already formed on the substrate.

8. The pattern forming method according to claim 7, wherein the first alignment mark matches the position of the first mark.

9. The pattern forming method according to claim 6, further comprising:
   adjusting the relative position of the substrate and the original plate after pressing the original plate against the first resin on the substrate, but before the irradiating, the adjusting being based on a first alignment mark formed in the original plate and a second alignment mark already formed on the substrate.

10. The pattern forming method according to claim 9, wherein the first alignment mark matches the position of the first mark.

11. The pattern forming method according to claim 1, wherein
   the first resin is a photocurable resin, and
   the second resin is a negative-tone photoresist.

12. The pattern forming method according to claim 1, further comprising:
   forming a second process film on the first process film after the first pattern has been transferred to the first process film;
   forming a second resin pattern on the second process film with a third resin, the second resin pattern including a second transfer pattern and a second mark;
   dispensing a third resin to cover the second mark of the second resin pattern;
   forming a second pattern including the second transfer pattern and the third resin covering the second mark; and
   transferring the second pattern to the second processing film.

13. The pattern forming method according to claim 12, wherein
   the second mark is for alignment to a third mark provided on the original plate for forming the second resin pattern, and
   the third mark is used for aligning the original plate with the substrate.

14. The pattern forming method according to claim 13, wherein, when the second resin pattern including the second transfer pattern and the second mark is formed, the relative position between the substrate and the original plate is adjusted by using the alignment mark and the third mark.

15. A semiconductor device manufacturing method comprising:
   imprinting a first resin pattern including a transfer pattern and a first mark on a first process layer of a semiconductor substrate using a first resin;

covering the first mark of the first resin pattern on the first process layer with a second resin; and transferring a first pattern to the first process layer by etching portions of the first process layer using the first resin and the second resin as an etch mask, the first pattern including the transfer pattern of the first resin pattern but not the first mark.

16. The semiconductor device manufacturing method according to claim 15, wherein the second resin is cured with light after dispensing.

17. The semiconductor device manufacturing method according to claim 15, wherein the second resin is a positive tone photoresist.

* * * * *